United States Patent
Dutartre et al.

(10) Patent No.: US 6,294,443 B1
(45) Date of Patent: Sep. 25, 2001

(54) METHOD OF EPITAXY ON A SILICON SUBSTRATE COMPRISING AREAS HEAVILY DOPED WITH BORON

(75) Inventors: Didier Dutartre, Meylan; Patrick Jerier, Grenoble, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/407,345

(22) Filed: Sep. 29, 1999

(30) Foreign Application Priority Data

Oct. 7, 1998 (FR) .................................................. 98 12755

(51) Int. Cl.$^7$ ................................................... H01L 21/20
(52) U.S. Cl. ............................................................ 438/504
(58) Field of Search ............................... 438/503, 504, 438/505, 506, 706, 913, 916, 974; 117/94, 97

(56) References Cited

U.S. PATENT DOCUMENTS 3,192,083    6/1965   Sirtl ...................................... 148/175

5,308,788 *  5/1994   Fitch etal. ............................... 117/86

FOREIGN PATENT DOCUMENTS 247 322 A1   7/1987  (DE) .............................. H01L/21/20

OTHER PUBLICATIONS

French Search Report from French Patent application 98 12755, filed Oct. 7, 1998.

* cited by examiner

Primary Examiner—Keith Christianson
(74) Attorney, Agent, or Firm—Wolf, Greenfield & Sacks, P.C.; James H. Morris; Theodore E. Galanthay

(57) ABSTRACT

A method of vapor phase epitaxy deposition of silicon on a silicon substrate on or in which exist areas containing dopants at high concentration, among which is boron, while avoiding a selfdoping of the epitaxial layer by boron, including the step of introducing a chlorinated gas, before the epitaxial deposition step, to etch the substrate across a thickness smaller than 100 nm.

29 Claims, 2 Drawing Sheets

METHOD OF EPITAXY ON A SILICON SUBSTRATE COMPRISING AREAS HEAVILY DOPED WITH BORON

BACKGROUND OF THE INVENTION

1. Field of the Invention

The present invention relates to the manufacturing of semiconductor components, and more specifically to the deposition by epitaxy of a silicon layer on a single-crystal silicon substrate.

2. Discussion of the Related Art

Generally, in the field of semiconductor component manufacturing, it is known to grow epitaxial layers of a determined conductivity type and doping level on substrates of a determined conductivity type, generally different from that of the epitaxial layer, and of a determined doping level. The epitaxy provides thin single-crystal layers having a controllable transversal doping level, conversely to methods needing a dopant diffusion step, in which the doping level decreases with the diffusion depth.

Vapor phase epitaxy methods, which have been developed for many years, yield very satisfactory results when the substrate doping level is homogenous and relatively low. However, in modern technologies, buried layers, that is, heavily-doped localized layers of the first and/or of the second conductivity type formed under the epitaxial layer, are more and more used. The buried layers are obtained by performing, in the substrate, a high dose implantation of a selected dopant before proceeding to the epitaxial growth. These layers are for example intended for forming bipolar transistor collectors and must be very heavily doped. This results in a known drawback, currently called selfdoping, which is that the implanted dopant has a tendency, during the epitaxy process, to dope the epitaxial layer above and beside the implanted region. The epitaxial layer then no longer has the desired resistivity. As the epitaxial layer becomes thinner, this disadvantage becomes more significant since the selfdoping phenomenon essentially occurs in the initial growth phase of this layer. Further, it obviously appears that the selfdoping rate of the epitaxial layer depends on the surface of the doped areas meant to become buried layers. The larger this surface area, the stronger the selfdoping. Thus, from one circuit to another, according to whether more or fewer buried layers have been made, the epitaxial layer will not have the same general resistivity. This phenomenon is difficult to master. It goes against what is aimed at in any industrial process, that is, obtaining controlled and repeatable results, which are, if possible, identical for different products of a given technology.

At the present time, many methods have been brought forward to attempt to solve selfdoping problems during deposition of a lightly-doped epitaxial layer on a substrate containing boron-implanted areas, or boron-implanted areas and arsenic-implanted areas. However, these methods have yielded more or less satisfactory results according to the operating conditions, and none has met with general approval up to now. Further, although some solutions have enabled reducing the boron selfdoping, they have worsened the selfdoping due to other dopants such as arsenic and, in the case where there are several types of dopant sources, the general result is not satisfactory.

SUMMARY OF THE INVENTION

Thus, the present invention aims at a method of epitaxial deposition of silicon on a silicon substrate in which, or above which, exist regions heavily doped with boron and possibly also with arsenic.

To achieve this and other objects, the present invention provides a method of vapor phase epitaxy deposition of silicon on a silicon substrate on or in which exist areas containing dopants at high concentration, among which is boron, while avoiding a selfdoping of the epitaxial layer by boron, including the steps of: a) optionally performing an initial anneal; b) performing an epitaxial deposition during a chosen time to obtain a desired general thickness; c) introducing a chlorinated gas, before the epitaxial deposition step, to etch the substrate across a small thickness, smaller than 100 nm.

According to an embodiment of the present invention, the chlorinated gas is HCl.

according to an embodiment of the present invention, the chlorinated gas is introduced during a limited time before the epitaxial deposition.

According to an embodiment of the present invention, the chlorinated gas is introduced during most of the initial anneal.

According to an embodiment of the present invention, the initial anneal is performed at a temperature on the order of 1100° C. and the epitaxial deposition is performed at a temperature on the order of 1050° C.

According to an embodiment of the present invention, the initial anneal is performed in the presence of hydrogen.

According to an embodiment of the present invention, the epitaxial deposition is performed in the presence of a boron source.

The foregoing objects, features and advantages of the present invention will be discussed in detail in the following non-limiting description of specific embodiments in connection with the accompanying drawings.

DETAILED DESCRIPTION

Figure 1:
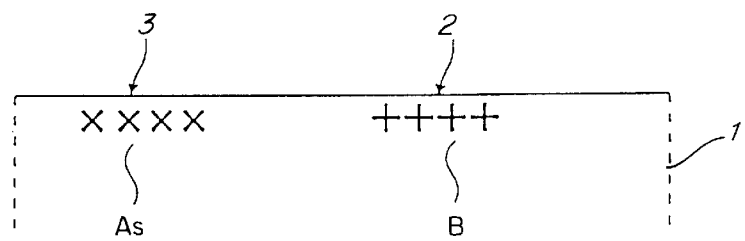
FIGS. 1 and 2 schematically show a method of epitaxy with the formation of buried layers.

Conventionally, to form an epitaxial layer on a single-crystal silicon substrate 1, as shown in FIG. 1, areas 2 and 3 in which are performed high dose implantations of dopants meant to form buried layers are first formed in substrate 1. In the example shown, area 2 contains boron and area 3 contains arsenic.

Figure 2:
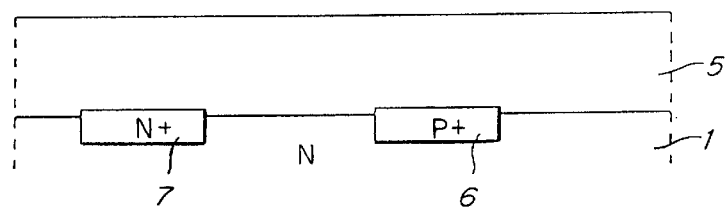

Then, as shown in FIG. 2, a single-crystal silicon layer 5 is developed by epitaxy and areas 2 and 3 then respectively correspond to buried layers 6 and 7. The epitaxial growth is for example performed under low pressure in the presence of hydrogen and of a silicon compound such as dichlorosilane or trichlorosilane and in the presence of a dopant compound, for example phosphine to form an N-type phosphorous doped layer. The problem raised is that the doping of the epitaxial layer is influenced by exodiffusions from the buried layers.

Figure 3:
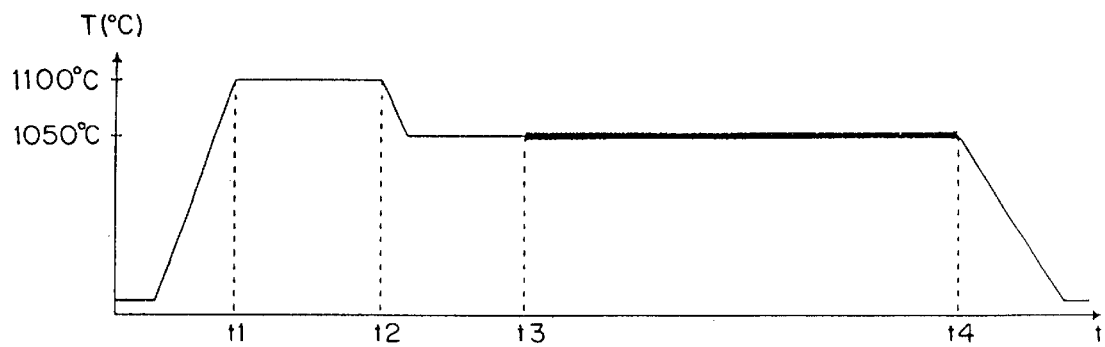
FIG. 3 illustrates an epitaxy sequence.

FIG. 3 illustrates, as an example, a conventional thermal sequence, with two temperature stages, used in an epitaxy.

The temperature is first increased in an epitaxy reactor, to reach at a time $t_1$ a desired temperature, generally higher than the temperature provided for the deposition, for example, 1100° C. in the presence of low pressure hydrogen, for example, 60 torrs (approximately $10^4$ Pa). The temperature is maintained for a certain duration, until a time $t_2$, after which the temperature is decreased to the temperature chosen for the epitaxial deposition, for example, 1050° C., and the temperature stabilization is awaited until a time $t_3$, then the actual deposition is performed in the presence of hydrogen and, for example, of dichlorosilane, until a time $t_4$. Duration $t_3$–$t_4$ is chosen, according to the partial gas pressures, to obtain a deposition of chosen thickness. After this, the temperature is decreased again at an equally determined rate. Many descriptions of such a method can be found in literature.

The present invention provides, before the actual epitaxy, that is, before time $t_3$, to introduce into the epitaxy reactor a chlorinated compound for etching a (superficial) substrate region. This chlorinated compound will for example be HCl. The partial pressure of the chlorinated gas and the duration of the operation will be chosen to obtain a small etching, under 100 nm at the silicon substrate surface. For example, by using a partial HCl pressure of 15 Pa in hydrogen at a partial pressure of 10000 Pa, 5 nm of silicon are etched in one minute at 1100° C.

Figure 4A:
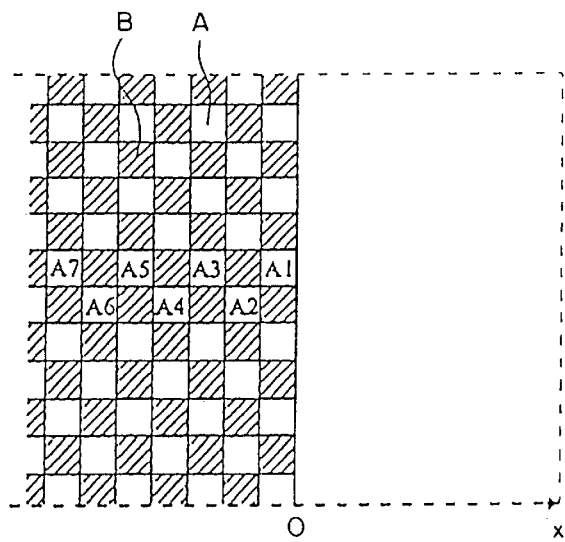
FIG. 4A is a top view of a test wafer and FIG. 4B illustrates compared results of boron selfdoping in epitaxial layers formed according to a conventional method and according to the method of the present invention.

FIG. 4A is a top view of a test wafer specifically made to analyze the efficiency of the method according to the present invention. Before the epitaxy, the wafer is divided into two portions, a first portion, to the right of the drawing, where no implantation is performed, and a second portion, to the left of the drawing, where a tablecloth of areas A, not implanted, and of areas B having undergone a strong boron implantation, is made. A1 to A7 designate non-implanted squares of the tablecloth extending from the limit between the right-hand and left-hand portions of the drawing. In one embodiment, the wafer has a 200-mm diameter and each square of the tablecloth has a dimension of 10×10 mm.

Figure 4B:
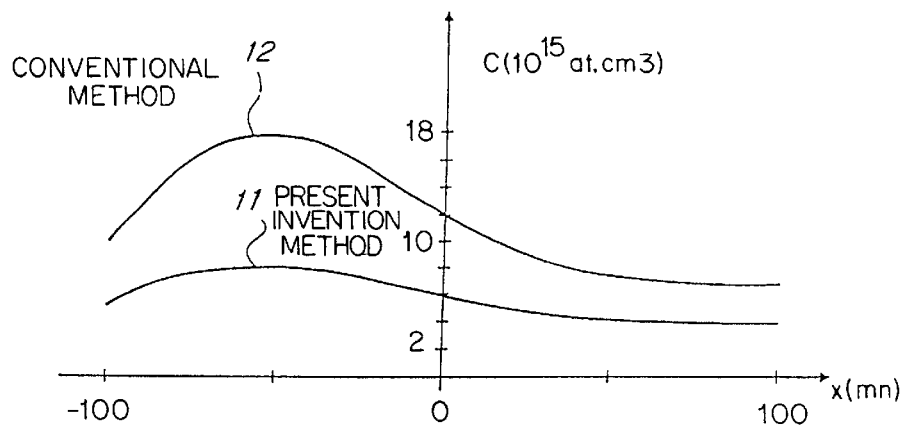

FIG. 4B illustrates compared results of boron selfdoping in epitaxial layers formed according to a conventional method and according to the method of the present invention above the wafer of FIG. 4A. The resistivities measured from the wafer surface above non-implanted areas are compared. Clearly, the influence of the implanted areas increases from square A1 to square A7.

The variation of conductivity (converted in the drawing into a dopant concentration), appears to be much smaller with the method of the present invention (curve 11) than with the conventional method (curve 12). Similar measurements performed with a test wafer similar to that of FIG. 4A, but in which the doped areas have undergone an arsenic implantation, have not shown any clear difference between the conventional method and the method of the present invention.

Thus, the result aimed at is obtained, that is, the boron selfdoping is reduced while the arsenic selfdoping is not altered.

An explanation of the phenomena which lead to this result, according to the present opinion of the inventors, will now be given. It should however be clear that, even if this theoretical explanation is erroneous or incomplete, this will not alter the scope of the present invention, the results of which have been demonstrated.

Figure 5:
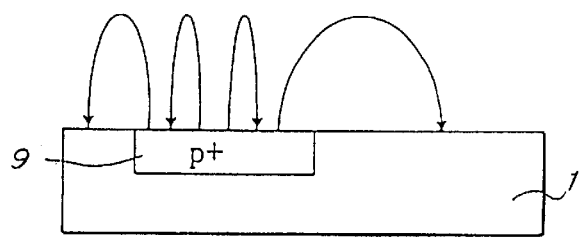
FIG. 5 schematically illustrates a possible explanation of boron selfdoping.

FIG. 5 schematically shows a substrate 1 in which boron atoms 9 have been implanted. The applicant considers that from the beginning of a heating, boron atoms exodiffuse from the surface of the implanted area into the gas, distribute over the entire substrate surface and slightly penetrate thereinto, to form a thin boron-doped layer, which forms the autodoped layer. According to the samples and to the operating conditions, this layer can actually impose its conductivity type, by holes, and reverse the conductivity type if the lower (substrate) and upper (epitaxial layer) areas are of type N.

The method according to the present invention enables removal of the thin selfdoped layer and thus considerable reduction of the selfdoping. The method is also very likely to remove boron present on the reactor walls. It should be noted that the etching according to the present invention is intended for removing the thin selfdoped layer, the thickness of which is extremely variable according to the operating conditions. Thus, in some cases, an etching over a few nanometers will be sufficient.

Of course, the present invention is likely to have various alterations, modifications, and improvements which will readily occur to those skilled in the art. For example, if the new process is desired to remain as compatible as possible with prior methods, a voluntary boron doping of the epitaxial layers formed could be provided, so that these layers substantially have the same behavior as prior epitaxial layers formed without using the present invention. However, this doping will then have the advantage of being perfectly controlled and of not varying across the chip surface. This boron doping can result from an addition of boroethane to the generally used phosphine.

Examples of implementation of the present invention have been given in the case where boron is present in a buried layer. The present invention also applies in the case where boron is present in a polysilicon or dielectric layer formed above the substrate.

The present invention also applies in other epitaxy conditions, for example, when the initial anneal is performed at the same temperature (900° C. to 1100° C.) as the epitaxy or else when the epitaxy starts during the temperature increase of the reactor. The present invention could also be applied in the context of low temperature epitaxies, for example, epitaxies at temperatures on the order of 600° C. with or without an initial anneal in a range from 800° C. to 900° C.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of vapor phase epitaxy deposition of silicon on a silicon substrate on or in which exist areas containing dopants at high concentration, among which is boron, while avoiding a selfdoping of the epitaxial layer by boron, including the step of introducing a chlorinated gas exempt of any silicon compound, before the epitaxial deposition step and while the substrate is at a high temperature, to etch the substrate across a thickness smaller than 100 nm.

2. The method of claim 1, including an initial anneal step.

3. The method of claim 2, wherein the initial anneal step is limited to a temperature increase phase.

4. The method of claim 1, wherein the chlorinated gas is HCl.

5. The method of claim 1, wherein the chlorinated gas is introduced during a limited time before the epitaxial deposition.

6. The method of claim 2, wherein the chlorinated gas is introduced during most of the initial anneal.

7. The method of claim 2, wherein the initial anneal is performed at a temperature of about 1100° C. and the epitaxial deposition is performed at a temperature of about 1050° C.

8. The method of claim 2, wherein the initial anneal is performed in the presence of hydrogen.

9. The method of claim 1, wherein the epitaxial deposition is performed in the presence of a boron source.

10. The method of claim 1, wherein the epitaxial deposition is performed at a low temperature, of about 600° C.

11. The method of claim 1, wherein a superficial silicon substrate region is etched by said introduction of a chlorinated gas.

12. The method of claim 1, wherein bringing the substrate to a high temperature causes the formation of a thin boron-doped layer.

13. The method of claim 12, wherein said step of introducing a chlorinated gas to etch includes etching the thin boron-doped layer prior to performing an epitaxial deposition.

14. The method of claim 1, wherein boron is provided in a buried layer in said substrate.

15. The method of claim 1, wherein said boron is provided in a polysilicon or dielectric layer formed over said substrate.

16. A method of growing an epitaxial layer on a silicon substrate, comprising the steps of:
providing on or in said silicon substrate areas containing dopants at high concentration and including boron;
heating so as to bring the doped silicon substrate to a predetermined high stabilization temperature;
introducing a chlorinated gas into an epitaxy reactor that houses said doped silicon substrate;
wherein during said step of introducing a chlorinated gas there is an absence of any introduction of a silicon compound into said reactor;
said step of introducing a chlorinated gas including causing etching of a silicon substrate region; and
after conclusion of said step of introducing a chlorinated gas to provide said etching, performing an epitaxial deposition including the introduction of a silicon compound into said reactor.

17. The method of claim 16, wherein the chlorinated gas is HCl.

18. The method of claim 16, wherein the chlorinated gas is introduced during a limited time before the epitaxial deposition.

19. The method of claim 16, wherein the chlorinated gas is introduced during most of the heating step.

20. The method of claim 16, wherein the heating step is performed at a temperature of about 1100° C. and the epitaxial deposition is performed at a temperature of about 1050° C.

21. The method of claim 16, wherein the heating is performed in the presence of hydrogen.

22. The method of claim 16, wherein the epitaxial deposition is performed in the presence of a boron source.

23. The method of claim 16, wherein the epitaxial deposition is performed at a low temperature, of about 600° C.

24. The method of claim 16, wherein a superficial silicon substrate region is etched by said introduction of a chlorinated gas.

25. The method of claim 16, wherein said heating step causes the formation of a thin boron-doped layer.

26. The method of claim 25, wherein said step of introducing a chlorinated gas to etch includes etching the thin boron-doped layer prior to performing an epitaxial deposition.

27. The method of claim 16, providing boron in a buried layer in said substrate.

28. The method of claim 16, providing boron in a polysilicon or dielectric layer formed over said substrate.

29. The method of claim 16, wherein the etching is across a thickness smaller than 100 nm.

* * * * *